(12) United States Patent
Lu

(10) Patent No.: US 11,624,956 B2
(45) Date of Patent: Apr. 11, 2023

(54) DISPLAY PANEL AND DISPLAY DEVICE

(71) Applicant: Wuhan China Star Optoelectronics Technology Co., Ltd., Wuhan (CN)

(72) Inventor: Yantao Lu, Wuhan (CN)

(73) Assignee: Wuhan China Star Optoelectronics Technology Go., Ltd., Wuhan (CN)

( * ) Notice: Subject to any disclaimer, the term of this patent is extended or adjusted under 35 U.S.C. 154(b) by 0 days.

(21) Appl. No.: 16/488,609

(22) PCT Filed: May 28, 2019

(86) PCT No.: PCT/CN2019/088719
§ 371 (c)(1),
(2) Date: Aug. 26, 2019

(87) PCT Pub. No.: WO2020/206823
PCT Pub. Date: Oct. 15, 2020

(65) Prior Publication Data
US 2022/0019103 A1  Jan. 20, 2022

(30) Foreign Application Priority Data

Apr. 10, 2019  (CN) .......................... 201910284515.1

(51) Int. Cl.
*G02F 1/1345* (2006.01)

(52) U.S. Cl.
CPC ...... *G02F 1/13452* (2013.01); *G02F 1/13454* (2013.01); *G02F 1/13458* (2013.01)

(58) Field of Classification Search
CPC ............. G02F 1/13458; G02F 1/13452; G02F 1/13454
See application file for complete search history.

(56) References Cited

U.S. PATENT DOCUMENTS

| | | | |
|---|---|---|---|
| 2008/0062373 A1* | 3/2008 | Kim | G02F 1/1345 349/151 |
| 2012/0146972 A1* | 6/2012 | Fujikawa | G02F 1/13452 345/206 |
| 2020/0211917 A1* | 7/2020 | Li | H05K 1/189 |
| 2021/0231995 A1* | 7/2021 | Lu | G02F 1/133308 |

FOREIGN PATENT DOCUMENTS

CN            107369692 A   * 11/2017

* cited by examiner

*Primary Examiner* — Dung T Nguyen
(74) *Attorney, Agent, or Firm* — PV IP PC; Wei Te Chung; Ude Lu

(57) ABSTRACT

The present disclosure provides a display panel and a display device including the same, in which heights of at least some of metal terminals in a flexible circuit board bonding pad increase in a direction away from a driving chip. Therefore, more space is reserved for connecting traces between the metal terminals and the driving chip, thereby avoiding occurrence of a display abnormality caused by short-circuiting between the connecting traces due to limitation of space for setting the connecting traces and avoiding the metal terminals being too close to a fan-out trace area in order to reduce impedance.

16 Claims, 6 Drawing Sheets

DISPLAY PANEL AND DISPLAY DEVICE

FIELD OF INVENTION

The present disclosure relates to a field of display technology, and particularly to a display panel and a display device.

BACKGROUND

With development of full-screen display technology, screen ratios of displays are continuously increasing, and lower borders of the displays are getting smaller. However, narrowing the lower borders directly causes space for setting a driving chip, traces or other components to be compressed, resulting in that the space for setting the traces to be limited, which may easily cause short-circuiting between the traces.

As shown in FIG. 1, a current display panel 100 comprises an array substrate 101. A flexible circuit board bonding pad 106 is disposed on a glass substrate of the array substrate 101. The flexible circuit board bonding pad 106 comprises metal terminals 1061. Connecting traces 107 are required between the flexible circuit board bonding pad 106 and the driving chip 105 for electrical connection. Fan-out traces 108 are required between the driving chip 105 and a display area 102 of the array substrate 101 for electrical connection. The connecting traces 107 and the fan-out traces 108 compress space for traces in a lower border of the array substrate 101. In the prior art, heights of the metal terminals 1061 are uniform, resulting in a smaller space near a side of the driving chip 105. Moreover, all of the connecting traces 107 must be electrically connected to the driving chip 105 through the space near the side of the driving chip 105, so that the connecting traces 107 near the side of the driving chip 105 are overcrowded, which may result in short circuit, causing display abnormality.

Therefore, it is necessary to provide a new display panel and a new display device to solve the aforementioned technical problems.

SUMMARY OF DISCLOSURE

The present disclosure provides a display panel and a display device comprising the same in order to solve the technical problem, in the prior art, that the metal terminals in the flexible circuit board bonding pad are uniform in size, resulting in the limited space for setting the connecting traces near the side of the driving chip and between the metal terminals and the driving chip, thereby easily causing short-circuiting between the connecting traces, and then causing display abnormality.

To solve the aforementioned technical problem, the present disclosure provides a technical solution as below.

The present disclosure provides a display panel, comprising:

an array substrate comprising a display area and a non-display area disposed outside the display area;

a driving chip disposed in the non-display area;

a flexible circuit board bonding pad disposed in the non-display area and located beside at least one side of the driving chip; and connecting traces disposed between the driving chip and the flexible circuit board bonding pad;

wherein the flexible circuit board bonding pad comprises metal terminals, each of the metal terminals has a same area or an area similar to each other, the metal terminals are shaped as polygons, arcs or combination thereof, and heights of at least some of the metal terminals increase in a direction away from the driving chip.

In the display panel of the present disclosure, the at least some of the metal terminals are a first metal terminal group, and other metal terminals are a second metal terminal group.

In the display panel of the present disclosure, the metal terminals of the first metal terminal group are sequentially arranged in a direction away from the driving chip.

In the display panel of the present disclosure, the first metal terminal group is disposed beside a side of the driving chip.

In the display panel of the present disclosure, at least some of the metal terminals of the second metal terminal group are disposed between the metal terminals of the first metal terminal group.

The present disclosure further provides a display panel, comprising:

an array substrate comprising a display area and a non-display area disposed outside the display area;

a driving chip disposed in the non-display area;

a flexible circuit board bonding pad disposed in the non-display area and located beside at least one side of the driving chip; and connecting traces disposed between the driving chip and the flexible circuit board bonding pad;

wherein the flexible circuit board bonding pad comprises metal terminals, and heights of at least some of the metal terminals increase in a direction away from the driving chip.

In the display panel of the present disclosure, the at least some of the metal terminals are a first metal terminal group, and other metal terminals are a second metal terminal group.

In the display panel of the present disclosure, the metal terminals of the first metal terminal group are sequentially arranged in a direction away from the driving chip.

In the display panel of the present disclosure, the first metal terminal group is disposed beside a side of the driving chip.

In the display panel of the present disclosure, at least some of the metal terminals of the second metal terminal group are disposed between the metal terminals of the first metal terminal group.

In the display panel of the present disclosure, each of the at least some of the metal terminals of the second metal terminal group has a height equal to a height of any metal terminal of the first metal terminal groups arranged adjacent to it.

In the display panel of the present disclosure, each of the at least some of the metal terminals of the second metal terminal group has a height between heights of two metal terminal of the first metal terminal groups arranged adjacent to it.

In the display panel of the present disclosure, each of the metal terminals has a same area or an area similar to each other.

In the display panel of the present disclosure, each of the metal terminals has a height of 0.01 mm to 3 mm.

In the display panel of the present disclosure, the metal terminals are shaped as polygons, arcs or combination thereof.

In the display panel of the present disclosure, a bottom of the flexible circuit board bonding pad is flush with a bottom of the driving chip.

In the display panel of the present disclosure, the non-display area comprises a fan-out trace area disposed between the display area and the driver chip, and distances between the fan-out trace area and the at least some of the metal terminals are decreased in a direction away from the driving chip.

In the display panel of the present disclosure, the display panel further comprises another flexible circuit board bonding pad, wherein the two flexible circuit board bonding pads are respectively disposed on opposite sides of the driving chip.

In the display panel of the present disclosure, the display panel further comprises a flexible circuit board, wherein the flexible circuit board comprises a body section and a first connecting section and a second connecting section respectively disposed on opposite sides of the body section, and the first connecting section and the second connecting section respectively connect the two flexible circuit board bonding pads.

The present disclosure further provides a display device comprising one of the aforementioned display panels.

In the display panel and the display device provided by the present disclosure, the heights of the at least some of the metal terminals in the flexible circuit board bonding pad increase in a direction away from the driving chip. Therefore, more space is reserved for the connecting traces between the metal terminals and the driving chip, thereby satisfying space requirement of the traces. This can avoid occurrence of a display abnormality caused by short-circuiting between the connecting traces due to limitation of the space for setting the connecting traces and avoid the metal terminals being too close to the fan-out trace area in order to reduce impedance and improve display quality.

BRIEF DESCRIPTION OF DRAWINGS

In order to more clearly illustrate the technical solutions in the embodiments of the present disclosure or the prior art, a brief description of accompanying drawings used in the description of the embodiments of the present disclosure or the prior art will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
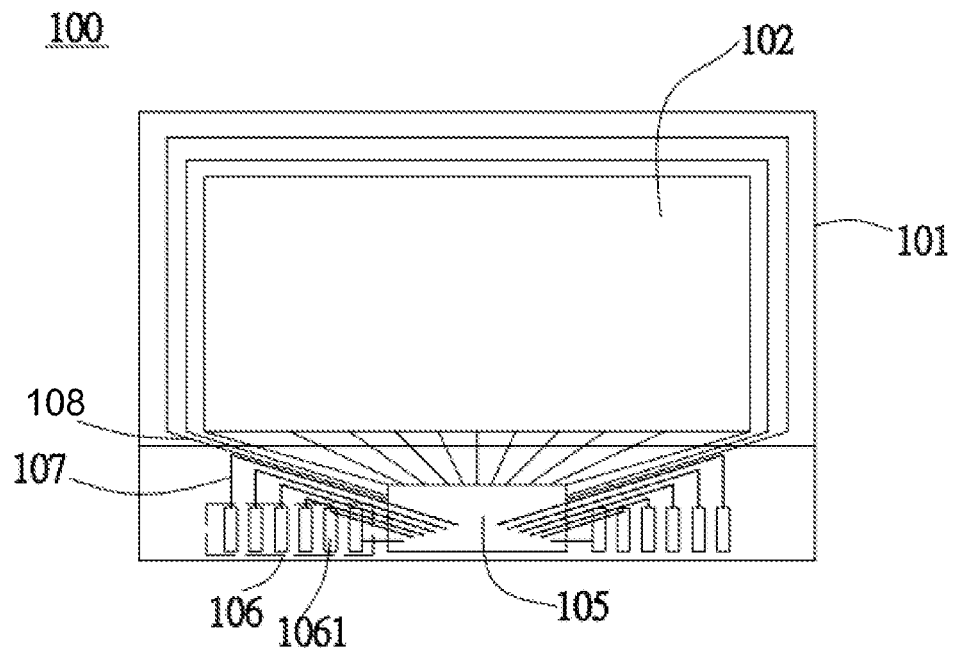
FIG. 1 is a schematic diagram of a current display panel.

The following description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structure are indicated by the same reference numerals.

The embodiments of the present disclosure can solve the technical problem of existing display panels and display devices that the metal terminals in the flexible circuit board bonding pad are uniform in size, resulting in the limited space for setting the connecting traces near the side of the driving chip and between the metal terminals and the driving chip, thereby easily causing short-circuiting between the connecting traces, and then causing display abnormality.

Figure 2:
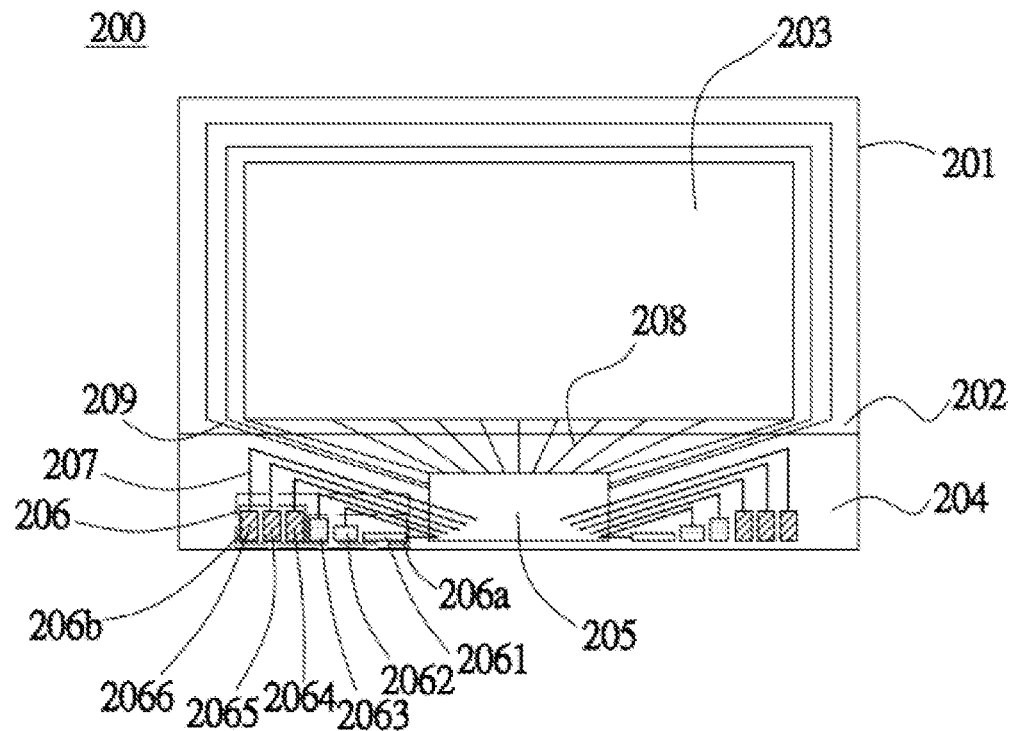
FIG. 2 is a schematic diagram of a display panel according to an embodiment of the present disclosure.

As shown in FIG. 2, the present disclosure provides a display panel 200 comprising an array substrate 201 and a color filter substrate 202 disposed opposite to the array substrate. The array substrate 201 comprises a display area 203 and a non-display area 204 disposed outside the display area 203. The non-display area 204 comprises a driving chip 205 and a flexible circuit board bonding pad 206 disposed beside at least one side of the driving chip 205. Connecting traces 207 are disposed between the driving chip 205 and the flexible circuit board bonding pad 206 for transmitting a display signal.

The display area 203 and the driving chip 205 are shaped as rectangles. Length of the driving chip 205 is less than that of the display area 203. Meanwhile, in order to minimize height of a lower border of the array substrate 201, a bottom of the flexible circuit board bonding pad 206 is flush with that of the driving chip 205. It can be understood that in other embodiments, the driving chip 205 can be shaped as other shapes. And, as long as the flexible circuit board bonding pad 206 is disposed beside a side of the driving chip 205, the bottom of the flexible circuit board bonding pad 206 may be lower or higher than that of the driving chip 205.

The flexible circuit board bonding pad 206 comprises metal terminals that are connected to the driving chip 205 through the connecting traces 207, respectively. Specifically, heights of at least some of the metal terminals increase in a direction away from the driving chip. 205. The at least some of the metal terminals are a first metal terminal group 206a, and other metal terminals are a second metal terminal group 206b. The metal terminals of the first metal terminal group 206a are arranged continuously or discontinuously. As shown in FIG. 2, the metal terminals of the first metal terminal group 206a are sequentially arranged in the direction away from the driving chip 205, that is, arranged continuously, and the first metal terminal group 206a is disposed beside a side of the driving chip 205. It can be understood that, in other embodiments, the metal terminals of the first metal terminal group 206a may be arranged discontinuously, that is, other metal terminals, such as at least some of the metal terminals of the second metal terminal group 206b, are disposed between the metal terminals of the first metal terminal group 206a.

Compared with the prior art, since the heights of the metal terminals of the first metal terminal group 206a increase in the direction away from the driving chip, a wiring space for the connecting traces 207, between the metal terminals of the first metal terminal group 206a and the driving chip 205, is greatly increased. This can avoid occurrence of a display abnormality caused by short-circuiting between the connecting traces 207 due to limitation of the space for setting the connecting traces 207.

It should be noted that a number of the metal terminals is two or more. For convenience of description, this embodiment is described by taking the number of metal terminals in the flexible circuit board bonding pad 206 as six. The metal terminals of the first metal terminal group 206a are sequentially arranged in the direction away from the driving chip 205, and the arrangement order is a metal terminal 2061, a metal terminal 2062, a metal terminal 2063, a metal terminal 2064, a metal terminal 2065, and a metal terminal 2066.

The metal terminals in the flexible circuit board bonding pad 206 may all be the first metal terminal group 206a. Alternatively, some of the metal terminals are the first metal terminal group 206a, and the remaining metal terminals are the second metal terminal group 206b.

Figure 3A:
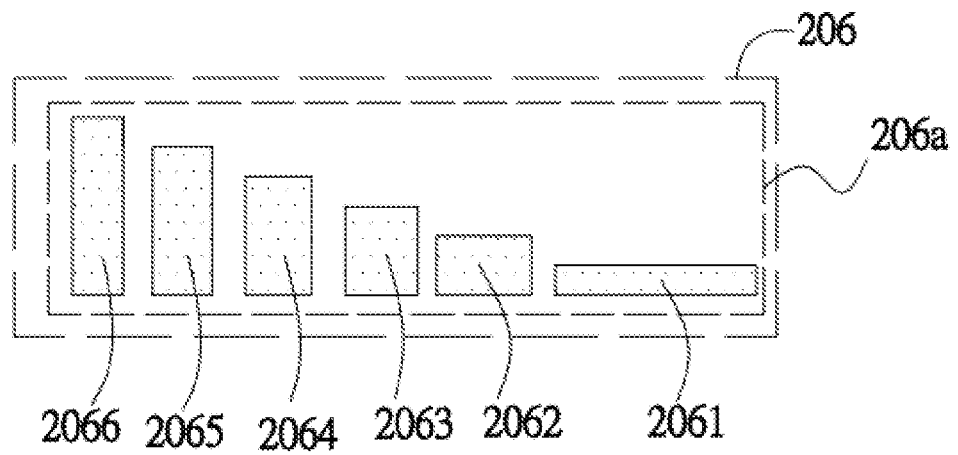
FIG. 3A is a schematic diagram of a first type of a flexible circuit board bonding pad according to an embodiment of the present disclosure.

Specifically, in the embodiment, the metal terminals in the flexible circuit board bonding pad 206 are all the first metal terminal group 206a. As shown in FIG. 3A, height of the metal terminal 2061<height of the metal terminal 2062<height of the metal terminal 2063<height of the metal terminal 2064<height of the metal terminal 2065<height of the metal terminal 2066. Compared with the prior art, the wiring space for the connecting traces 207, between the metal terminals near the driving chip 205 and the driving chip 205, is greatly increased, thereby avoiding the occurrence of the display abnormality caused by short-circuiting between the connecting traces 207 due to the limitation of the space for setting the connecting traces 207.

In another embodiment, at least two metal terminals are the first metal terminal group 206a, and the remaining metal terminals are the second metal terminal group 206b, wherein the first metal terminal group 206a comprises at least two metal terminals arranged adjacent to each other.

Figure 3B:
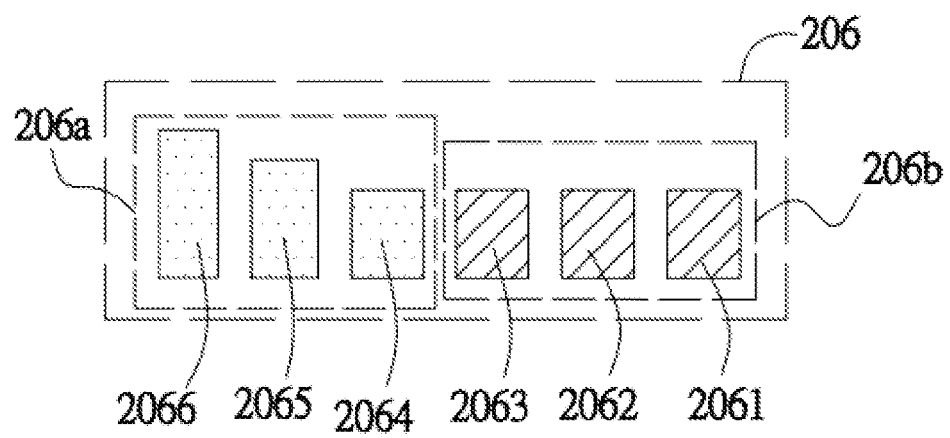
FIG. 3B is a schematic diagram of a second type of a flexible circuit board bonding pad according to an embodiment of the present disclosure.

For example, the second metal terminal group 206b is deposited between the first metal terminal group 206a and the driving chip 205. As shown in FIG. 3B, the first metal terminal group 206a comprises the metal terminal 2064, the metal terminal 2065, and the metal terminal 2066. The second metal terminal group 206b comprises the metal terminal 2061, the metal terminal 2062, and the metal terminal 2063. The height of the metal terminal 2064<the height of the metal terminal 2065<the height of the metal terminal 2066. In order to increase wiring space, the heights of the metal terminal 2061, the metal terminal 2062, and the metal terminal 2063 are less than or equal to the height of the metal terminal 2064. In other embodiments, the heights of the metal terminal 2061, the metal terminal 2062, and the metal terminal 2063 may be greater than the height of the metal terminal 2064.

Figure 3C:
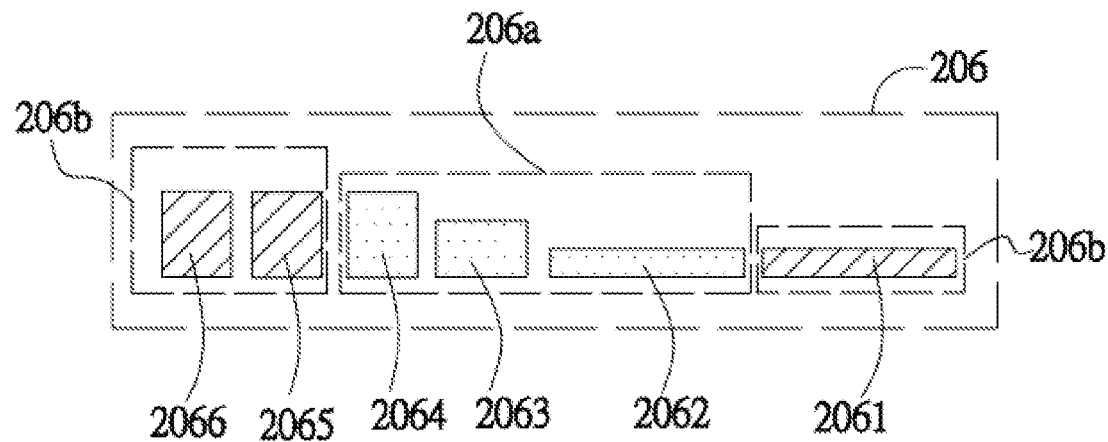
FIG. 3C is a schematic diagram of a third type of a flexible circuit board bonding pad according to an embodiment of the present disclosure.

For another example, the second metal terminal group 206b is deposited beside both sides of the first metal terminal group 206a. As shown in FIG. 3C, the first metal terminal group 206a comprises the metal terminal 2062, the metal terminal 2063, and the metal terminal 2064. The second metal terminal group 206b comprises the metal terminal 2061, the metal terminal 2065, and the metal terminal 2066. The height of the terminal 2062<the height of the metal terminal 2063<the height of the metal terminal 2064, and the height of the metal terminal 2061 is less than or equal to the height of the metal terminal 2062. In order to increase the wiring space, the heights of the metal terminal 2065 and the metal terminal 2066 may be less than or equal to the height of the metal terminal 2064.

Figure 3D:
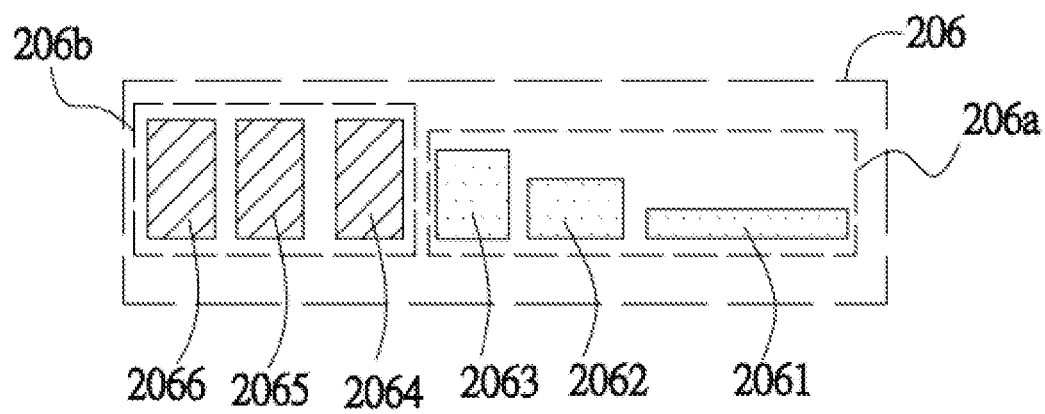
FIG. 3D is a schematic diagram of a fourth type of a flexible circuit board bonding pad according to an embodiment of the present disclosure.

For another example, the second metal terminal group 206b is deposited beside the side of the first metal terminal group 206a away from the driving chip 205. As shown in FIG. 3D, the first metal terminal group 206a comprises the metal terminal 2061, the metal terminal 2062, and the metal terminal 2063. The second metal terminal group 206b comprises the metal terminal 2064, the metal terminal 2065, and the metal terminal 2066. The height of the metal terminal 2061<the height of the metal terminal 2062<the height of the metal terminal 2063. In order to increase the wiring space, the heights of the metal terminal 2064, the metal terminal 2065, and the metal terminal 2066 may be less than or equal to the height of the metal terminal 2063.

Alternatively, at least two metal terminals are the first metal terminal group 206a, and the remaining metal terminals are the second metal terminal group 206b, wherein at least some of the metal terminals of the second metal terminal group 206b are disposed between the metal terminals of the first metal terminal group 206a. The height of each of the at least some of the metal terminals of the second metal terminal group 206b is equal to the height of any metal terminal of the first metal terminal groups 206a adjacent thereto or is between the heights of the metal terminals of the first metal terminal group 206a adjacent thereto.

Figure 3E:
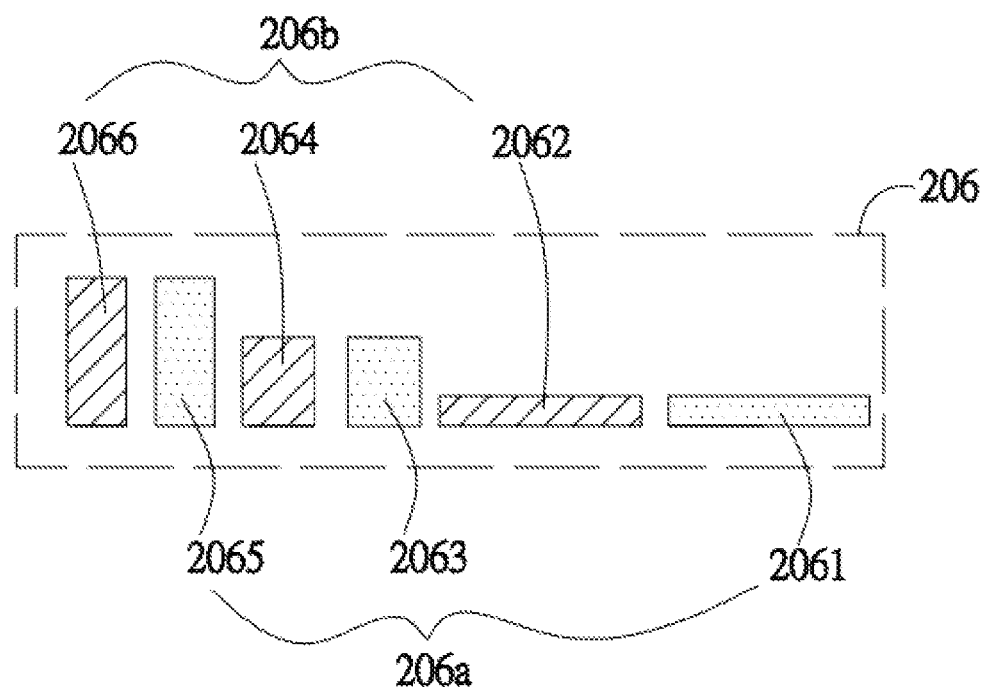
FIG. 3E is a schematic diagram of a fifth type of a flexible circuit board bonding pad according to an embodiment of the present disclosure.

For example, the first metal terminal group 206a may comprise at least two spaced-apart metal terminals. As shown in FIG. 3E, the first metal terminal group 206a comprises the metal terminal 2061, the metal terminal 2063, and the metal terminal 2065. The height of the metal terminal 2061<the height of the metal terminal 2063<the height of the metal terminal 2065. The second metal terminal group 206b comprises the metal terminal 2062, the metal terminal 2064, and the metal terminal 2066. In order to increase the wiring space, the height of the metal terminal 2062 is equal to the height of the metal terminal 2061, the height of the metal terminal 2064 is equal to the height of the metal terminal 2063, and the height of the metal terminal 2066 is equal to the height of the metal terminal 2065. In other embodiments, the height of the metal terminal 2062 may be between the height of the metal terminal 2061 and the height of the metal terminal 2063, and the height of the metal terminal 2064 may be between the height of the metal terminal 2063 and the height of the metal terminal 2065. In other embodiments, the number of metal terminals of the second metal terminal group 206b between the metal terminal 2061 and the metal terminal 2063 is not limited to one and may be plural, and the present disclosure should not be limited thereto.

Further, each of the metal terminals has an area similar to each other. Preferably, each of the metal terminals has a same area. The area of each metal terminal should not be too small to ensure that each metal terminal has an effective pressing area, thereby ensuring a stable connection of signal contact points while maintaining pressing resistance of the metal terminals to reduce bonding impedance. Furthermore, since the heights of the metal terminals of the first metal terminal group 206a increase in the direction away from the driving chip 205, widths of the metal terminals of the first metal terminal group 206a are decreased in the direction away from the driving chip 205. Taking FIG. 3A as an example, the width of the metal terminal 2061>the width of the metal terminal 2062>the width of the metal terminal 2063>the width of the metal terminal 2064>the width of the metal terminal 2065>the width of the metal terminal 2066. Generally, the height of each metal terminal ranges from 0.01 mm to 3 mm, and the width of each metal terminal ranges from 0.01 mm to 3 mm.

Figure 4A:
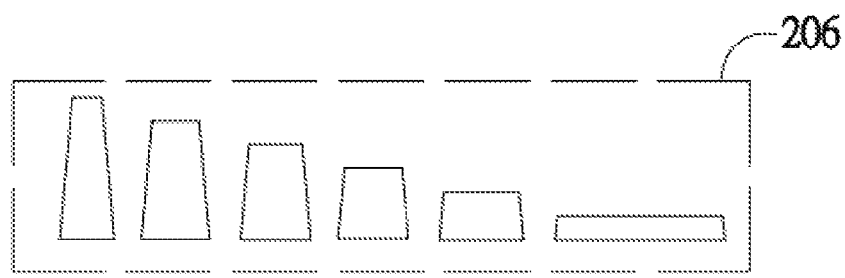
FIG. 4A is a schematic diagram showing shapes of a first type of metal terminals of a flexible circuit board bonding pad according to an embodiment of the present disclosure.
Figure 4B:
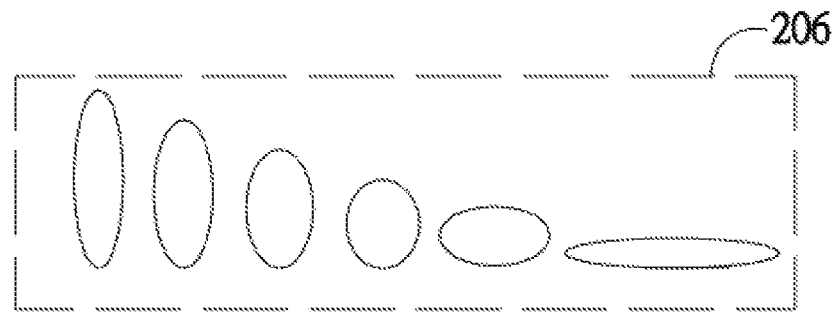
FIG. 4B is a schematic diagram showing shapes of a second type of metal terminals of a flexible circuit board bonding pad according to an embodiment of the present disclosure.

Further, the metal terminals are shaped as polygons or arcs. The polygons may be rectangles, trapezoids, pentagons or the like. For example, as shown in FIGS. 3A to 3E, the metal terminals are shaped as rectangles. For another example, as shown in FIG. 4A, the metal terminals in the flexible circuit board bonding pad 206 are shaped as trapezoids and each of the trapezoids is a positive trapezoid having a narrow upper side and a wide lower side so that more wiring space is provided above the metal terminals for the connecting traces 207. For another example, the metal terminals in the flexible circuit board bonding pad 206 are shaped as arcs. The arcs may be circles, ellipses, semicircles, curves or the like. As shown in FIG. 4B, the metal terminals are shaped as ellipses. In other embodiments, the metal terminals may be shaped as other polygons, arcs or combination thereof, and the present disclosure should not be limited thereto.

With continued reference to FIG. 2, the non-display area 204 further comprises a fan-out trace area disposed between the display area 203 and the driver chip 205. Specifically, the fan-out trace area comprises first fan-out traces 208 and second fan-out traces 209. The first fan-out traces 208 connects data lines deposited in the display area 203 and the driving chip 205 for transmitting a data signal to the display area 203. The second fan-out traces 209 connects scan lines deposited in the display area 203 and the driving chip 205 for transmitting a scan signal into the display area 203. The second fan-out traces 209 are traces of gate on array (GOA). The second fan-out traces 209 comprises parallel segments deposited outside the display area 203 and parallel to an edge of the display area 203, and inclined segments deposited in the non-display are 204 and directed to the driving chip 205. The inclined segments of the second fan-out traces 209 are connected to the driving chip 205 to input the scan signal, and the parallel segments of the second fan-out traces 209 are connected to the scan lines to output the scan signal.

Distances between the fan-out traces area and the metal terminals of the first metal terminal group 206a are decreased in the direction away from the driving chip 205. On the one hand, the space for setting the connecting traces 207 is increased, thereby avoiding the occurrence of the display abnormality caused by short-circuiting between the connecting traces 207 due to the limitation of the space for setting the connecting traces 207. On the other hand, compared to the prior art, distances from the metal terminals to the second fan-out traces 209 are greatly increased. Therefore, more wiring space is provided for the connecting traces 207 and the second fan-out traces 209 to ensure maximum use of the limited wiring space, thereby avoiding the metal terminals being too close to the second fan-out traces 209 in order to reduce impedance and improve display quality. Since the space between the metal terminals and the inclined segments of the second fan-out traces 209 is the wiring area of the connecting traces 207, the connecting traces 207 may also be designed as inclined segments. Therefore, the wiring of the connecting traces 207 is more flexible, thereby effectively utilizing the space between the metal terminals and the second fan-out traces 209.

Generally, for all traces in the array substrate 201 to be uniformly wired, the array substrate 201 comprises two identical flexible circuit board bonding pads 206 which are respectively disposed on opposite sides of the driving chip 205 and are symmetric with each other.

Figure 5A:
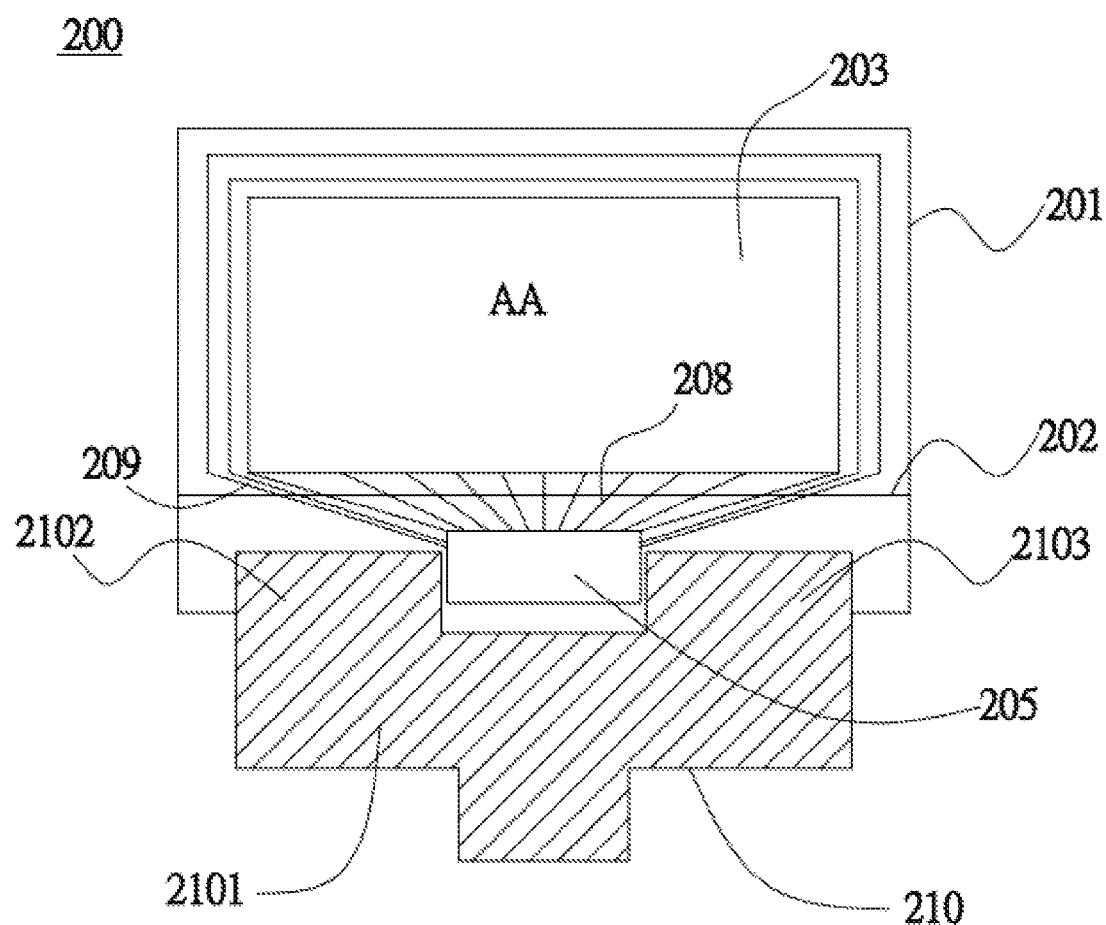
FIG. 5A is a schematic diagram of a first type of a flexible circuit board according to an embodiment of the present disclosure.

As shown in FIG. 5A, in order to correspondingly cooperate with the use of the flexible circuit board bonding pad 206, the display panel 200 further comprises a flexible circuit board 210 bound to the non-display area 204 of the array substrate 201 through the metal terminals in the flexible circuit board bonding pad 206. The metal terminals transmit a signal from the flexible circuit board 210 to the driving chip 205 through the connecting traces 207. Specifically, the flexible circuit board 210 is in a "Y" shape, and comprises a body section 2101 and a first connecting section 2102 and a second connecting section 2013 respectively disposed on opposite sides of the body section 2101, and the first connecting section 2102 and the second connecting section 2103 respectively connect the two flexible circuit board bonding pads 206. The first connecting section 2102 and the second connecting section 2103 respectively connect the flexible circuit board bonding pads 206.

Further, connecting terminals (not shown) are disposed on the first connecting section 2102 and the second connecting section 2103 and are respectively disposed corresponding to the metal terminals. The number, size, and shape of the connecting terminals are identical to that of the metal terminals in order to ensure that the connecting terminals can be completely fitted to the metal terminals, thereby ensuring effective signal transmission between the flexible circuit board 210 and the driving chip 205.

Figure 5B:
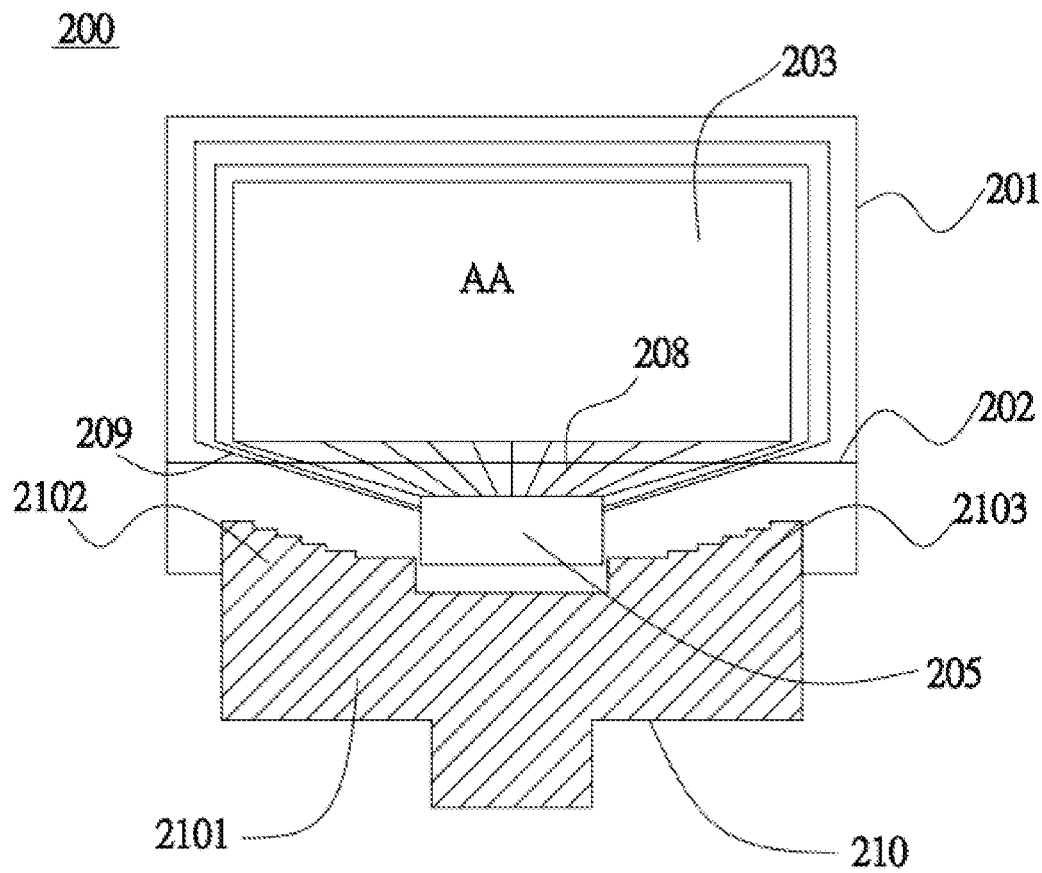
FIG. 5B is a schematic diagram of a second type of a flexible circuit board according to an embodiment of the present disclosure.

Preferably, as shown in FIG. 5B, shapes of the first connecting section 2102 and the second connecting segment 2103 of the flexible circuit board 210 can be correspondingly designed according to an arrangement of the metal terminals in the flexible circuit board bonding pad 206. That is, portions of the first connecting section 2102 and the second connecting segment 2103 near the driving chip 205 have lower heights, and portions of the first connecting section 2102 and the second connecting segment 2103 away from the driving chip 205 have higher heights. Therefore, area of the flexible circuit board 210 and space of the array substrate 201 on which the flexible circuit board 210 is attached to can be reduced.

Figure 6:
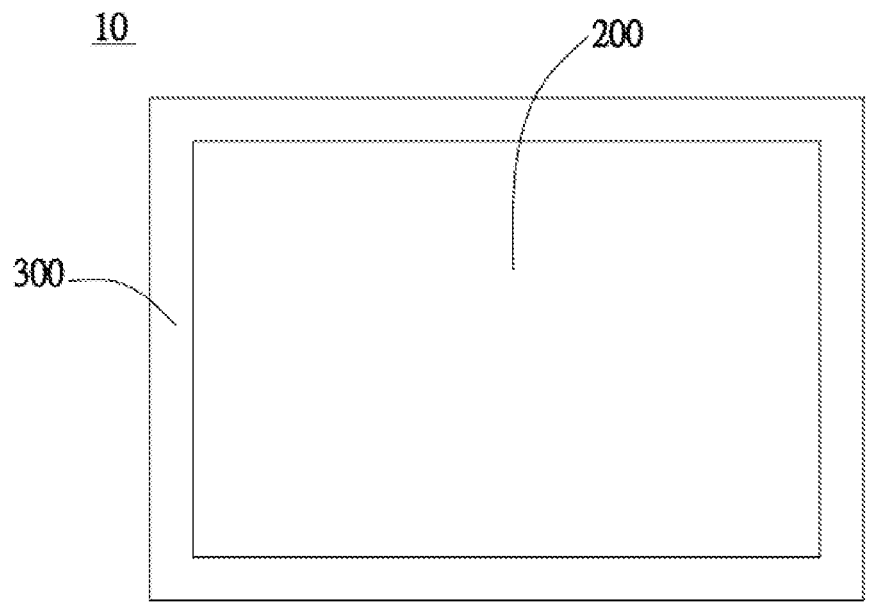
FIG. 6 is a schematic diagram of a display device according to an embodiment of the present disclosure.

As shown in FIG. 6, the present disclosure further provides a display device 10 comprising a display panel 200 according to an embodiment of the present disclosure and a backlight module 300. The display device 10 may be any product or component having a display function, such as a mobile phone, a tablet computer, a television, and a digital camera. The display device 10 has technical effects of a display panel 200 according to an embodiment of the present disclosure, and details are not described herein again.

In the display panel and the display device provided by the present disclosure, the heights of the at least some of the metal terminals in the flexible circuit board bonding pad increase in a direction away from the driving chip. Therefore, more space is reserved for the connecting traces between the metal terminals and the driving chip, thereby satisfying space requirement of the traces. This can avoid occurrence of a display abnormality caused by short-circuiting between the connecting traces due to limitation of the space for setting the connecting traces and avoid the metal terminals being too close to the fan-out trace area in order to reduce impedance and improve display quality.

In the above, the present application has been described in the above preferred embodiments, but the preferred embodiments are not intended to limit the scope of the present application, and a person skilled in the art may make various modifications without departing from the spirit and scope of the present application. The scope of the present application is determined by claims.

What is claimed is:

1. A display panel, comprising:
an array substrate comprising a display area and a non-display area disposed around the display area;
a driving chip disposed on the array substrate in the non-display area;
two flexible circuit board bonding pads disposed on the array substrate in the non-display area and respectively located on opposite sides of the driving chip, wherein each of the flexible circuit board bonding pads comprises a plurality of metal terminals sequentially arranged in a direction away from the driving chip, heights of the metal terminals increase in the direction away from the driving chip; and
a flexible circuit board comprising a body section, a first connecting section, and a second connecting section, wherein the first connecting section and the second connecting section are respectively disposed on opposite sides of the body section, spaced apart from each other, and respectively connected to the two flexible circuit board bonding pads, and the flexible circuit board does not cover the driving chip.

2. The display panel according to claim 1, further comprising a plurality of connecting traces connecting the driving chip and the metal terminals.

3. The display panel according to claim 1, wherein the metal terminals have a same area.

4. The display panel according to claim 1, wherein each of the metal terminals is shaped as a polygon, an arc, or a combination thereof.

5. A display device, comprising the display panel according to claim 1.

6. A display panel, comprising:
an array substrate comprising a display area and a non-display area disposed around the display area;
a driving chip disposed on the array substrate in the non-display area;
two flexible circuit board bonding pads disposed on the array substrate in the non-display area and respectively located on opposite sides of the driving chip, wherein each of the flexible circuit board bonding pads comprises a plurality of metal terminals that are sequentially arranged in a direction away from the driving chip and are divided into a first metal terminal group and a second metal terminal group, and heights of the metal terminals of the first metal terminal group increase in the direction away from the driving chip; and
a flexible circuit board comprising a body section, a first connecting section, and a second connecting section, wherein the first connecting section and the second connecting section are respectively disposed on opposite sides of the body section, spaced apart from each other, and respectively connected to the two flexible circuit board bonding pads, and the flexible circuit board does not cover the driving chip.

7. The display panel according to claim 6, wherein further comprising a plurality of connecting traces connecting the driving chip and the metal terminals.

8. The display panel according to claim 6, wherein in each of the flexible circuit board bonding pads, the second metal terminal group is disposed between the first metal terminal group and the driving chip, and the metal terminals of the second metal terminal group have a same height that is less than the heights of the metal terminals of the first metal terminal group.

9. The display panel according to claim 6, wherein in each of the flexible circuit board bonding pads, the first metal terminal group is disposed between the second metal terminal group and the driving chip, and the metal terminals of the second metal terminal group have a same height that is greater than the heights of the metal terminals of the first metal terminal group.

10. The display panel according to claim 6, wherein in each of the flexible circuit board bonding pads, the metal terminals of the second metal terminal group and the metal terminals of the first metal terminal group are alternately arranged, and each of the metal terminals of the second metal terminal group has a height equal to a height of one adjacent metal terminal of the first metal terminal group.

11. The display panel according to claim 6, wherein in each of the flexible circuit board bonding pads, the metal terminals of the second metal terminal group and the metal terminals of the first metal terminal group are alternately arranged, and each of the metal terminals of the second metal terminal group has a height between heights of two adjacent metal terminals of the first metal terminal group.

12. A display panel according to claim 6, wherein the metal terminals have a same area.

13. The display panel according to claim 6, wherein each of the metal terminals has a height of 0.01 mm to 3 mm.

14. The display panel according to claim 6, wherein each of the metal terminals is shaped as a polygon, an arc, or a combination thereof.

15. The display panel according to claim 6, wherein bottoms of the flexible circuit board bonding pads are flush with a bottom of the driving chip.

16. The display panel according to claim 6, wherein the non-display area comprises a fan-out trace area disposed between the display area and the driver chip, and distances between the fan-out trace area and the metal terminals of the first metal terminal group are decreased in the direction away from the driving chip.

* * * * *